United States Patent [19]

Kowalik et al.

[11] Patent Number: 5,194,827
[45] Date of Patent: Mar. 16, 1993

[54] VOLTAGE CONTROLLED HIGH FREQUENCY EQUALIZATION

[75] Inventors: Jason A. Kowalik, Broomfield; Michael C. Ward, Lakewood, both of Colo.

[73] Assignee: Ampex Systems Corporation, Redwood City, Calif.

[21] Appl. No.: 683,224

[22] Filed: Apr. 10, 1991

[51] Int. Cl.$^5$ ............................................. H03F 3/191
[52] U.S. Cl. ................................. 330/304; 330/294; 333/28 R
[58] Field of Search ................. 330/304; 333/28 R; 358/160, 184

[56] References Cited

U.S. PATENT DOCUMENTS

| | | | |
|---|---|---|---|
| 4,117,412 | 9/1978 | Holman, II | 330/304 |
| 4,122,417 | 10/1978 | Takasaki et al. | 330/304 |
| 4,291,276 | 9/1981 | Ida | 330/294 |
| 4,295,161 | 10/1981 | Hettiger | 358/34 |
| 4,433,301 | 2/1984 | Lukes | 330/304 |
| 4,633,200 | 12/1986 | Adler | 330/304 |
| 4,755,771 | 7/1988 | Sakaida et al. | 330/304 |

FOREIGN PATENT DOCUMENTS

| | | | |
|---|---|---|---|
| 2751566 | 5/1978 | Fed. Rep. of Germany | 330/294 |
| 57-5410A | 1/1982 | Japan | 333/28 R |
| 60-117908 | 6/1985 | Japan | 333/28 R |

Primary Examiner—Robert J. Pascal
Assistant Examiner—Tan Dinh
Attorney, Agent, or Firm—Richard J. Roddy

[57] ABSTRACT

A method and apparatus for equalizing high frequency video signals is disclosed. A video signal to be equalized is received at an input terminal of a network and an equalized video signal is provided from an output of an operational amplifier to an output terminal of the network. The equalized video signal is fedback to one input of the operational amplifier. The video signal to be equalized is coupled to another input of the operational amplifier and is also coupled to respective ones of a plurality of alterable circuit elements such as varactor diodes, which function to mitigate distortions to the frequency response characteristic of the video signal to be equalized by cancelling the effect thereon by the video signal to be equalized.

2 Claims, 1 Drawing Sheet

VOLTAGE CONTROLLED HIGH FREQUENCY EQUALIZATION

BACKGROUND OF THE INVENTION

1. Field of the Invention

This invention relates to the equalization of high frequency video signals and, more particularly, to voltage controlling the equalization of high frequency video signals.

2. Description of Related Art

Equalization of high frequency signals typically involves, as a basic requirement for the ideal transmission channel, an ability to transmit the signal over a range of frequencies without introducing gain, or amplitude, or phase changes that are dependent on the frequency of the transmitted signal. In that ideal system, one could, in theory, avoid a frequency dependent distortion of the signal. However, the ideal channel does not exist and, consequently, to obtain an accurate replica of the original signal upon its reception or reproduction, it is necessary to compensate for distortion in the signal. The compensation process is known as equalization.

Voltage controlled equalizers for equalization of signals transmitted over a channel having a non-uniform frequency response are known in the art. See, for example, U.S. Pat. No. 4,633,200 issued Dec. 30, 1986.

High frequency video signals can also be equalized by networks comprising various combinations of resistors (R) and capacitors (C). While there are RC networks, which are known to equalize video signals, they typically increase the differential phase and differential gain distortion of the equalized video signals to unacceptable levels.

Accordingly, it is an object of the present invention to achieve the high frequency equalization needed by video signals while greatly reducing the differential phase and the differential gain distortion that are typically associated with known equalization embodiments, which operate on video signals.

SUMMARY OF THE INVENTION

These and other problems are solved and these and other objects are achieved in accordance with the principles of our invention in which a method and apparatus for equalizing high frequency video signals receive a video signal to be equalized and provide an equalized video signal from an output of an operational amplifier to an output terminal. The equalized video signal is fedback to one input of the operational amplifier. The video signal to be equalized is coupled to another input of the operational amplifier and is also coupled to respective ones of a plurality of alterable circuit elements such as varactor diodes, which function to mitigate distortions to the frequency response characteristic of the video signal to be equalized by cancelling the effect thereon by the video signal to be equalized.

BRIEF DESCRIPTION OF THE DRAWING

These and other advantages of the present invention will become apparent from the following detailed description when taken in conjunction with the accompanying drawing in which.

DETAILED DESCRIPTION

Figure 1:
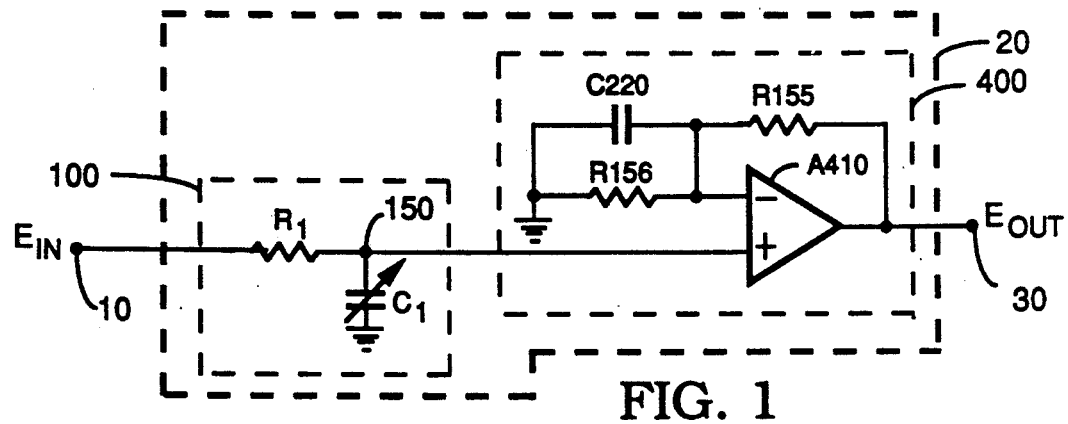
FIG. 1 is a schematic diagram of a RC network including a variable capacitor, which is useful in describing the principles of our invention.

In FIG. 1, an input terminal 10 is adapted to receive an input video signal to be equalized $E_{IN}$ by RC network 20 to provide an output equalized video signal $E_{OUT}$ at output terminal 30. Within RC network 20 are situated two RC networks, which are shown in FIG. 1 as input RC network 100 and feedback RC network 400. Feedback RC network 400 embodies an RC network for feeding back the equalized output video signal $E_{OUT}$ to an operational difference amplifier $A_{410}$, which could be any standard operational difference amplifier such as those manufactured by Elantec and known as model numbers EL2020 or EL2030.

Operational difference amplifier $A_{410}$ provides the equalized output voltage $E_{OUT}$ to output terminal 30 in response to the algebraic difference between a first input, here illustratively a plus (+) input, and a second amplifier input, here illustratively a negative (−) input. Amplifier $A_{410}$, which typically draws very little current from its respective inputs, amplifies the algebraic difference of its two input voltages by an amplification gain factor K, which is typically very large, and extends the amplified voltage difference as output signal $E_{OUT}$.

Figure 2:
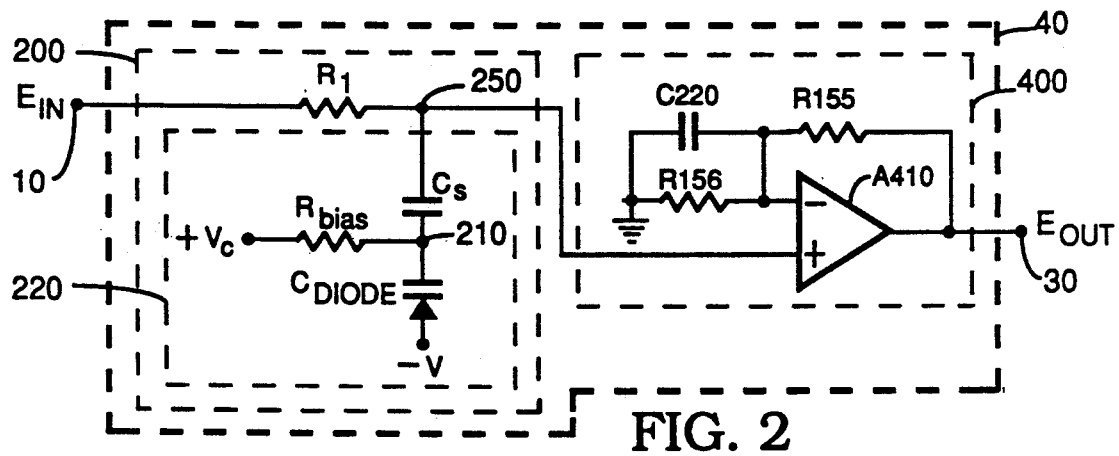
FIG. 2 is a schematic diagram of a RC network including one varactor diode, which is useful in describing the principles of our invention.
Figure 3:
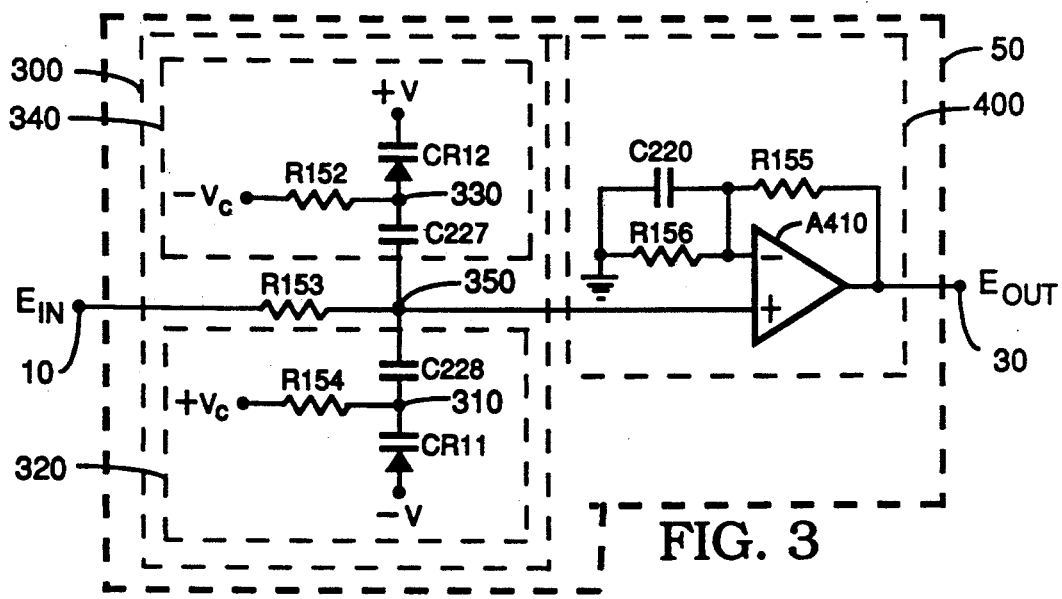
FIG. 3 is a schematic diagram of a RC network including two varactor diodes, which is useful in describing the principles of our invention.

The first input to amplifier $A_{410}$, here the plus (+) input, is provided by input RC network 100, which is also embodied within RC network 20. As an aside and as will soon be made clear in the ensuing description of FIG. 2, the first input to amplifier $A_{410}$ shown in FIG. 2, i.e. the input shown there as the plus (+) input, is provided by input RC network 200, which is within RC network 40 of FIG. 2. Further, as will later be made clear in the ensuing description of FIG. 3, the first input to amplifier $A_{410}$ shown in FIG. 3, i.e. the input shown there as the plus (+) input, is provided by input RC network 300, which is within RC network 50 of FIG. 3. The second input to amplifier $A_{410}$ in each of FIGS. 1, 2 and 3, i.e. the input shown there as the negative (−) input, is provided by a feedback circuit from an output of amplifier $A_{410}$ through resistor $R_{155}$ and then at node 450 jointly (a) to the second, i.e. negative (−), input of amplifier $A_{410}$ as well as (b) to ground through the parallel circuit consisting of resistor $R_{156}$ and capacitor $C_{220}$. For our purposes, on the one hand and as is hopefully now made clear from the above discussion, feedback RC network 400 is repeated in each of RC networks 20, 40, and 50 of, respectively, FIGS. 1, 2 and 3. On the other hand, input RC networks 100, 200 and 300 of, respectively, FIGS. 1, 2 and 3 are each distinctly different from each other.

Continuing with our focus on FIG. 1, input RC network 100 is embodied so that input voltage $E_{IN}$ can be extended from input terminal 10 through resistor $R_1$ jointly at node 150 (a) to the first input, here the plus (+) input, of amplifier $A_{410}$ within feedback RC network 400 as well as (b) through variable capacitor $C_1$ to ground. Having now defined the RC structure of network 20 in FIG. 1, it is now possible to apply straightforward linear analysis of such a network structure, for example, using linear transformation analysis theory found in many standard textbooks such as, for example, the text S. Ivar Pearson and George J. Maler, *Introduc-*

*tory Circuit Analysis*, New York: John Wiley & Sons, Inc., 1965. The LaPlace transformation transfer function G(s) for network 20 can be written as:

$$G(s) = \frac{E_{OUT}(s)}{E_{IN}(s)} = \frac{R_{155} C_{220}\left[s + \frac{R_{155} + R_{156}}{C_{220} R_{155} R_{156}}\right]}{R_1 C_1 \left[s + \frac{1}{R_1 C_1}\right]} \quad (1)$$

From equation (1) it is clear that a pole exists at the complex frequency corresponding to:

$$s = \frac{-1}{R_1 C_1} \quad (2)$$

and that a zero exists at the complex frequency corresponding to:

$$s = \frac{-(R_{155} + R_{156})}{C_{220} R_{155} R_{156}} \quad (3)$$

What this means is that, since capacitor $C_1$ is a variable capacitor the frequency response of network 20 can be adjusted by an adjustment of the value of capacitor $C_1$ in input RC network 100. For example, increasing the value of capacitor $C_1$ will reduce the value of the pole and will reduce the high frequency response of network 20 while decreasing the value of capacitor $C_1$ will increase the value of the pole and will increase the high frequency response of network 20. Noteworthy, adjusting the value of capacitor $C_1$ does not, for most practical purposes, affect the low frequency response of network 20 but rather, for most practical purposes, affects the high frequency response of network 20. Also, it is preferable that the pole and the zero should nominally be at the same complex frequency. Accordingly, the values of $R_1$ and $C_1$ as well as the values of $C_{220}$ and $R_{155}$ and $R_{156}$ may be selected to achieve that result.

Turning now to FIG. 2 in which input RC network 100 of FIG. 1 has been replaced by input RC network 200 of FIG. 2. Otherwise, the structure of FIG. 2 is the same as the structure of FIG. 1. Staying focused on FIG. 2, resistor $R_1$ of input RC network 200 can be the same as resistor $R_1$ of input RC network 100; however, variable capacitor $C_1$ of input RC network 100 is replaced with capacitance circuit 220. Capacitance circuit 220 comprises a series combination of direct current blocking capacitor $C_S$ connected to varactor diode $C_{DIODE}$ at node 210. As an aside, varactor diodes have a property that they introduce a capacitance into a circuit, which is inversely related to the reverse bias voltage placed upon the varactor diode. Here the varactor diode $C_{DIODE}$ could be a Motorola Model No. MV209 varactor diode, which will provide variable capacitance values in the range of approximately five picofarads to 40 picofarads. Continuing, capacitance circuit 220 is connected at node 250 between the first input, here the plus (+) input, of amplifier $A_{410}$ within feedback RC network 400 and a negative direct current bias voltage having a value of $-V$ volts. At node 210 between the series combination of capacitor $C_S$ and varactor diode $C_{DIODE}$, there is circuitwise inserted a bias resistor $R_{bias}$ which in turn is connected to a direct current control voltage source for supplying a positive direct current voltage having a value of $+V_C$ volts. As an aside, note that in this example the voltage across varactor diode $C_{DIODE}$ is positive, i.e. $\{V_C-(-V)\}$ is positive, as opposed to $+V_C$ necessarily being positive. Accordingly, the described polarities are only for purposes of illustration and are not by way of limitation.

Continuing, functionally, note that, on the one hand, capacitor $C_S$ will block the direct current supplied from either the bias voltage source $-V$ or the control voltage source $+V_C$ so that direct current from such sources does not reach the first input, here the plus (+) input, of amplifier $A_{410}$ within feedback RC network 400. And of importance, note that the bias voltage across $C_{DIODE}$ is not affected by any direct current voltage at the plus (+) input of amplifier $A_{410}$. Note also that, on the other hand, capacitor $C_S$ will not block input video signals such as those represented by input voltage $E_{in}$ at input terminal 10 so that the alternating current video signals from such sources will reach node 210 of input RC network 220. Thereby, with an alternating current signal across varactor diode $C_{DIODE}$, the input video signals $E_{IN}$ will modulate the capacitance of varactor diode $C_{DIODE}$. In that manner, the frequency response of network 40 will be dynamically varied by the very video signals that need to be equalized as they pass through network 40. Further, note that capacitor $C_S$ and varactor diode $C_{DIODE}$ are electrically connected in series. Therefore, if the capacitance value of capacitor $C_S$ is much larger than the capacitance value of varactor diode $C_{DIODE}$, then the capacitive reactance component of the circuit impedance will be dominated by the capacitance value of varactor diode $C_{DIODE}$. It may be noted that is a practical consideration.

Any luminance component in the video input signal $E_{IN}$ will modulate the capacitance of varactor diode $C_{DIODE}$ according to the following functional relationship where $V_{DIODE}$ represents the voltage across the varactor diode:

$$\begin{aligned}\text{Capacitance of diode } C_{DIODE} &= f(V_{DIODE}) \\ &= f((V_C - (-V)) + \\ &\quad \text{Video Luminance}) \\ &= f(V_C + V + \text{Video Luminance})\end{aligned} \quad (4)$$

As noted earlier and from equation (4), the capacitance of a varactor diode is inversely proportional to the voltage across the diode in the sense that capacitance is approximately linear with respect to the logarithm of the voltage across the diode except that the slope of the curve is negative, i.e. the capacitance decreases as the voltage across the diode increases, and vice versa.

Accordingly and unfortunately, the functional relationship shown in equation (4) can be interpreted to mean that the high (rather than the low) frequency response of RC network 40 gives rise to a differential gain, or amplitude, distortion, and that the high (rather than the low) frequency phase of RC network 40 gives rise to a differential phase distortion. We have found that a typical video luminance signal $E_{IN}$ at input terminal 10 will typically change the capacitance values of varactor diode $C_{DIODE}$ by approximately four picofarads when $V_{DIODE}$ is approximately 3.5 volts. That gives rise to the high frequency response problem that is solved using the principles of our invention.

The embodiment in FIG. 3 of the principles of our invention solves those and other problems. Network 50 includes the above described feedback network 400, as did network 20 and network 40 of FIGS. 1 and 2, respectively. Network 50 also includes input network 300, which, while it appears at first blush to have some of the characteristics of either input network 100 or input network 200, is distinctly different from network 100 and network 200 of FIGS. 1 and 2, respectively.

Firstly, capacitance circuit 320 of FIG. 3, which is substantially similar to capacitance circuit 220 of FIG. 2, comprises a series combination of capacitor $C_{228}$ and varactor diode $CR_{11}$, which are connected at node 350 between the first input, here the plus (+) input, of amplifier $A_{410}$ within feedback RC network 400 and a negative direct current bias voltage having a value of $-V$ volts. At node 310 between the series combination of capacitor $C_{228}$ and varactor diode $CR_{11}$, there is circuitwise inserted a bias resistor $R_{154}$ which in turn is connected to a direct current control voltage source for supplying a positive direct current control voltage having a value of $+V_C$ volts, i.e. as mentioned earlier when $V_{DIODE}$, or $\{V_C-(-V)\}$, is positive. We have found a value of $V_{DIODE}$ in the range of about three volts to about 21 volts to be satisfactory. So far the operation of network 50 with its feedback network 400 and its input network 320 within network 300 is very much the same as network 40 of FIG. 2.

Secondly, input capacitance circuit 340, which is quite similar to input capacitance circuits 220 and 320, comprises a series combination of capacitor $C_{227}$ and varactor diode $CR_{12}$, which are connected at node 350 between the first input, here the plus (+) input, of amplifier $A_{410}$ within feedback RC network 400 and a positive direct current bias voltage having a value of $+V$ volts. We have found a value of V equal to about 12 volts to be satisfactory. At node 330 between the series combination of capacitor $C_{227}$ and varactor diode $CR_{12}$, there is circuitwise inserted a bias resistor $R_{152}$ which in turn is connected to a direct current control voltage source for supplying a negative direct current control voltage having a value of $-V_C$ volts, i.e. in a manner paralleling the earlier comments relating to the voltage across the varactor diode, when $-V_{DIODE}$ is negative, or when $\{-V_C-V\}$ is negative.

Functionally, as the control voltage $V_C$ increases, the voltage across varactor diode $CR_{11}$ increases and the value of its capacitance decreases. Similarly, as control voltage $-V_C$ decreases, the voltage across varactor diode $CR_{12}$ increases and the value of its capacitance decreases. Therefore, the capacitance values of varactor diodes $CR_{11}$ and $CR_{12}$ decrease when the magnitude of the control voltage $V_C$ increases. Similarly, the capacitance values of varactor diodes $CR_{11}$ and $CR_{12}$ increase when the magnitude of the control voltage decreases. Further, since the capacitance values of capacitors $C_{228}$ and $C_{227}$ are respectively assumed to be, but do not necessarily have to be, much larger than the capacitance values of varactor diodes $CR_{11}$ and $CR_{12}$, respectively, then the capacitive reactance component of the circuit impedance will be dominated by the capacitance of the varactor diodes $CR_{11}$ and $CR_{12}$. Further, since networks 320 and 340 are electrically in parallel, the capacitance values of varactor diodes $CR_{11}$ and $CR_{12}$ are additive. Further, assume that the capacitance values of varactor diodes $CR_{11}$ and $CR_{12}$ are approximately equal. Then, in order to have the same RC time constant from input network 300 (see equation (2) above), since the capacitance values are additive and hence provide a doubling to the circuit capacitance value, then the value of resistor $R_{153}$ in input circuit 300 of FIG. 3 is halved from, for example, the value of resistor $R_{bias}$ in input circuit 200 of FIG. 2. In addition, on the one hand, note that the capacitance value contributed by network 320 is given by the functional relationship:

$$\text{Capacitance of diode network 320} = f((V_C - (-V)) + \text{Video Luminance}) \qquad (5)$$
$$= f(V_C + V + \text{Video Luminance})$$

which is the same as equation (4) above. On the other hand, note that the capacitance value contributed by network 340 would be given by the functional relationship:

$$\text{Capacitance of diode network 340} = f(V - (-V_C + \text{Video Luminance})) \qquad (6)$$
$$= f(V + V_C - \text{Video Luminance})$$

Thus, the capacitance values of networks 320 and 340 are modulated by the video signal to be equalized $E_{IN}$ at input terminal 10 using an algebraic process by which the luminance component of the video signal to be equalized $E_{IN}$ is additive to the reverse bias voltage of one varactor diode, which decreases its capacitance, and is negative to the reverse bias voltage of the other varactor diode, which increases its capacitance thereby cancelling the effect of the video signal, which has the net effect of equalizing the video signal in accordance with the principles of our invention.

A parts list of the RC elements shown in FIG. 3, which have not already been defined, is as follows:

| Resistors | Value (ohms) |
|---|---|
| $R_{152}$ | 100,000 |
| $R_{153}$ | 1,240 |
| $R_{154}$ | 100,000 |
| $R_{155}$ | 1,000 |
| $R_{156}$ | 357 |

| Capacitors | Value (picofarads) |
|---|---|
| $C_{220}$ | 270 |
| $C_{227}$ | 10,000 |
| $C_{228}$ | 10,000 |

In an alternative embodiment, we could have chosen to omit resistor $R_{156}$ from network 400. Omitting resistor $R_{156}$ is equivalent to resistor $R_{156}$ having a value approaching infinity. That would means that equation (1) could then be rewritten as the following equation (7):

$$G(s) = \frac{E_{OUT}(s)}{E_{IN}(s)} = \frac{R_{155} C_{220} \left[s + \frac{1}{R_{155} C_{220}}\right]}{R_1 C_1 \left[s + \frac{1}{R_1 C_1}\right]} \qquad (7)$$

while the zero at the complex frequency shown in equation (3) could then be rewritten as the following equation (8):

$$s = \frac{-1}{R_{155} C_{220}} \quad (8)$$

The foregoing description of the principles of our invention is by way of illustration and example only and not by way of limitation. For example, although several illustrative embodiments of an equalization circuit in accordance with the principles of our invention have been shown and described, other alternative embodiments are possible and would be clear to one skilled in the art upon an understanding of the principles of our invention, for example, the bias and control voltage polarities could be reversed. Also, it is not necessary that the capacitance values of capacitors $C_{228}$ and $C_{227}$ be much larger than the capacitance values of varactor diodes $CR_{11}$ and $CR_{12}$. Accordingly, the scope of our invention is to be limited only by the appended claims.

What is claimed is:

1. Apparatus for equalizing high frequency video signals, the apparatus comprising:
   an input terminal adapted to receive a video signal to be equalized;
   an output terminal adapted to provide an equalized video signal;
   a resistor-capacitor network for feeding back the equalized video signal to one input of an operational amplifier;
   a voltage controlled network responsive to the video signal to be equalized (a) for changing the frequency response characteristic of the apparatus and (b) for equalizing the video signal to be equalized by algebraically adding the video signal to be equalized with a bias voltage signal and by adjusting an impedance of the voltage controlled network in response to the algebraically added video and bias voltage signals and (c) for coupling the received video signal to be equalized to a second input of the operational amplifier and
   wherein the voltage controlled network comprises circuit impedance means responsive to the video signal to be equalized for mitigating distortions to the frequency response characteristic of the video signal to be equalized and
   wherein the circuit impedance means comprises a plurality of varactor diode circuit elements whose circuit impedance is altered in response to the video signal to be equalized when the video signal to be equalized is applied thereto.

2. A method for equalizing high frequency video signals, the method comprising the steps of:
   receiving a video signal to be equalized;
   providing an equalized video signal from an output of an operational amplifier to an output terminal;
   feeding back the equalized video signal to one input of an operational amplifier;
   responsive to the video signal to be equalized, changing a frequency response characteristic and equalizing the video signal to be equalized by algebraically adding the video signal to be equalized with a bias voltage and coupling the received video signal to be equalized to another input of the operational amplifier;
   applying the video signals to be equalized to respective ones of a plurality of circuit elements which have an impedance that is altered in response to the applied video signals to be equalized;
   applying the video signals to be equalized to the other input of the operational amplifier; and
   respectively processing the video signals to be equalized for mitigating distortions to the frequency response characteristic on the video signal to be equalized by the altered circuit elements.

* * * * *